United States Patent
Hsing et al.

(10) Patent No.: US 10,224,804 B1
(45) Date of Patent: Mar. 5, 2019

(54) DRIVING CIRCUIT, POWER CONVERSION DEVICE AND DRIVING METHOD OF POWER SWITCH

(71) Applicant: DELTA ELECTRONICS, INC., Taoyuan (TW)

(72) Inventors: Lei-Chung Hsing, Taoyuan (TW); Kuo-Ying Liu, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 15/919,199

(22) Filed: Mar. 12, 2018

(30) Foreign Application Priority Data

Sep. 7, 2017 (CN) .......................... 2017 1 0799910

(51) Int. Cl.
| | |
|---|---|
| H02M 1/08 | (2006.01) |
| H02M 7/537 | (2006.01) |
| H02M 1/084 | (2006.01) |
| H02M 1/38 | (2007.01) |
| H03K 17/16 | (2006.01) |
| H02M 7/217 | (2006.01) |
| H02M 7/538 | (2007.01) |
| H02M 1/32 | (2007.01) |
| H02M 1/088 | (2006.01) |

(Continued)

(52) U.S. Cl.
CPC .............. *H02M 1/084* (2013.01); *H02M 1/08* (2013.01); *H02M 1/088* (2013.01); *H02M 1/32* (2013.01); *H02M 1/38* (2013.01); *H02M 7/217* (2013.01); *H02M 7/537* (2013.01); *H02M 7/538* (2013.01); *H02M 7/5395* (2013.01); *H02M 7/53871* (2013.01); *H03K 17/168* (2013.01)

(58) Field of Classification Search
CPC ............ H02M 7/537; H02M 7/53871; H02M 7/5395; H02M 1/08; H02M 1/084; H02M 1/088; H02M 1/32
See application file for complete search history.

(56) References Cited

U.S. PATENT DOCUMENTS 6,323,625 B1 * 11/2001 Bhargava ................ F01D 15/10
322/32
2013/0229209 A1 9/2013 Miyauchi et al.
(Continued)

FOREIGN PATENT DOCUMENTS

JP 2014230307 A 12/2014

OTHER PUBLICATIONS

The pertinent parts of US20130229209A1.

*Primary Examiner* — Timothy J Dole
*Assistant Examiner* — Ishrat Jamali
(74) *Attorney, Agent, or Firm* — CKC & Partners Co., Ltd.

(57) ABSTRACT

A driving circuit includes a power switch driver and a plurality of current-limiting circuits. The power switch driver is configured to output a driving signal according to a switching signal. Each of the current-limiting circuits has an input terminal electrically coupled to a corresponding one of output terminals of the power switch driver respectively. Output terminals of the current-limiting circuits are electrically coupled to a control terminal of a power switch. The power switch driver is configured to selectively output the driving signal to one of a plurality of output terminals according to a load state of the power switch, such that the driving signal is outputted to the control terminal of the power switch via one of the current-limiting circuits.

20 Claims, 6 Drawing Sheets

(51) Int. Cl.
*H02M 7/5395* (2006.01)
*H02M 7/5387* (2007.01)

(56) References Cited

U.S. PATENT DOCUMENTS

| | | | |
|---|---|---|---|
| 2015/0204730 A1* | 7/2015 | Daitoku | G01K 7/01 |
| | | | 374/178 |
| 2017/0302152 A1* | 10/2017 | Watanabe | H02M 1/088 |
| 2017/0302190 A1* | 10/2017 | Ikarashi | H02M 7/493 |

* cited by examiner

DRIVING CIRCUIT, POWER CONVERSION DEVICE AND DRIVING METHOD OF POWER SWITCH

RELATED APPLICATIONS

This application claims priority to China Application Serial Number 201710799910.4, filed Sep. 7, 2017, which is herein incorporated by reference.

BACKGROUND

Field of Invention

The disclosure relates to a driving circuit, particularly to a driving circuit of a power switch.

Description of Related Art

With development of power electronics, various of power switches are applied in many types of power conversion devices, such as three-phase inverter circuits or three-phase rectifier circuits, etc.

In different load states, the switching frequencies of the power transistors driven by the conventional power switch driving circuit are not the same, so that the raising of switching efficiency and the reduction of the influence of electromagnetic interference (EMI) cannot be taken into consideration at the same time.

SUMMARY

One aspect of the present disclosure is a driving circuit. The driving circuit includes a power switch driver and a plurality of current-limiting circuits. The power switch driver is configured to output a driving signal according to a switching signal. Each of the current-limiting circuits has an input terminal electrically coupled to a corresponding one of a plurality of output terminals of the power switch driver respectively. A plurality of output terminals of the current-limiting circuits are electrically coupled to a control terminal of the power switch. The power switch driver outputs the driving signal selectively via one of a plurality of output terminals according to a load state of the power switch, such that the driving signal is outputted to the control terminal of the power switch via one of the current-limiting circuits.

Another aspect of the present disclosure is a power conversion device. The power conversion device includes a plurality of power switches, a processing circuit, and a plurality of driving circuits. The power switches are configured to be turned on or turned off selectively according to a plurality of driving signals respectively, so as to perform power conversion between an AC power and a DC power. The processing circuit is configured to output a plurality of switching signals respectively. The driving circuits are electrically coupled between the processing circuit and a corresponding one of the power switches respectively, so as to output the driving signals according to the switching signals respectively. Each of the driving circuits includes a power switch driver and a plurality of current-limiting circuits. The power switch driver is configured to output the driving signal according to the corresponding switching signal. Each of the current-limiting circuits has an input terminal electrically coupled to the corresponding one of a plurality of output terminals of the power switch driver respectively, and a plurality of output terminals of the current-limiting circuits are electrically coupled to the control terminal of the power switch. The power switch driver outputs the driving signal selectively via the corresponding one of the output terminals according to the load current passing though the corresponding power switch, such that the driving signal is outputted to the control terminal of the power switch via one of the current-limiting circuits.

Yet another aspect of the present disclosure is a power switch driving method including the following steps: detecting a load state of the power switch and correspondingly outputting a load-detecting signal by a load detecting circuit; determining, by a processing circuit, a load mode according to the load-detecting signal to selectively output a driving signal to a control terminal of the power switch via one of a plurality of current-limiting circuits according to the load mode; and turning on or turning off the power switch selectively according to the driving signal.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure.

It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that, although the terms "first," "second," etc., may be used herein to describe various elements, these elements should not be limited by these terms. These terms are used to distinguish one element from another.

Figure 1:
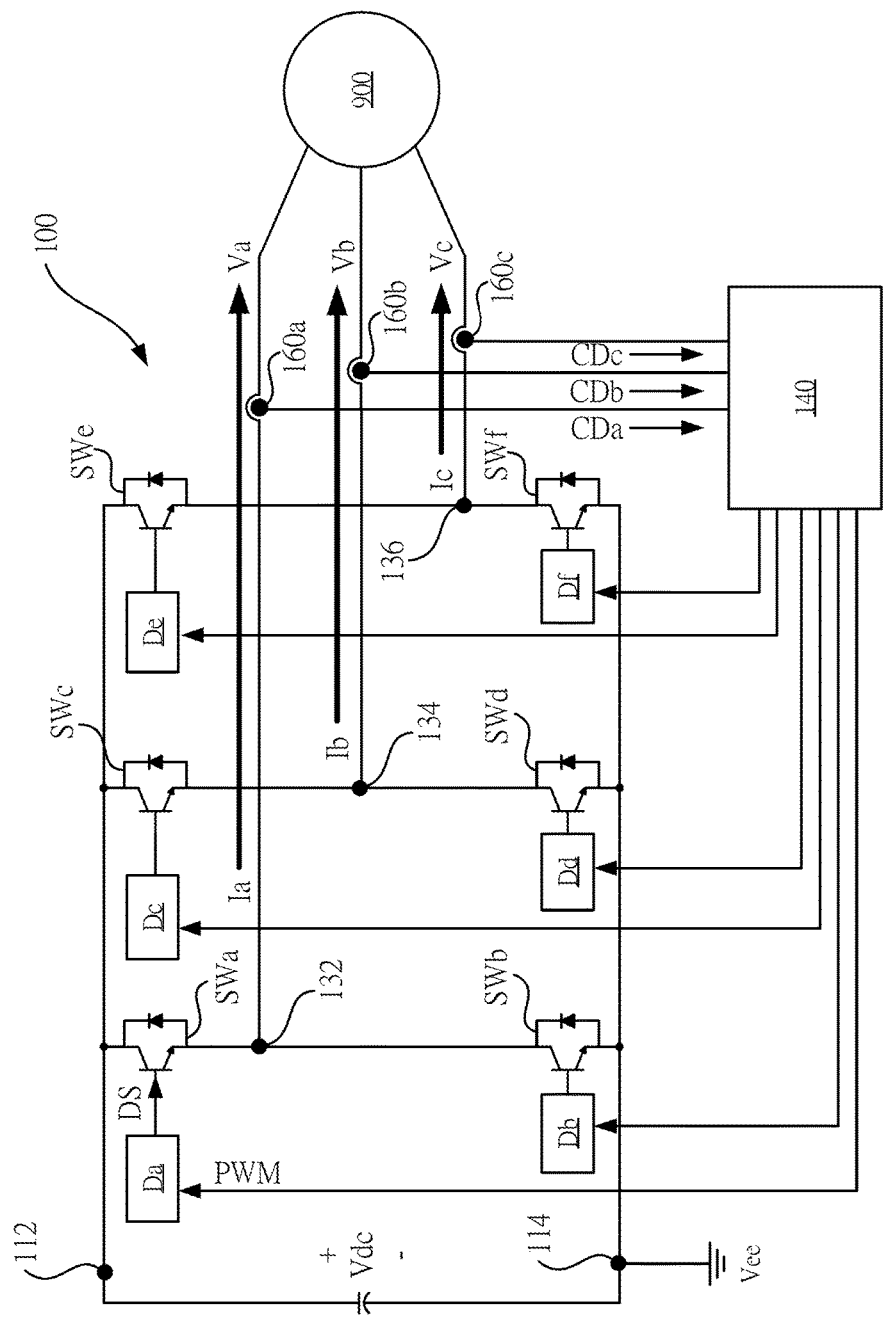
FIG. 1 is a schematic diagram illustrating a power conversion device in accordance with some embodiments of the disclosure.

Please refer to FIG. 1. FIG. 1 is a schematic diagram illustrating a power conversion device 100 in accordance with some embodiments of the disclosure. As shown in FIG. 1, in some embodiments, the power conversion device 100 includes multiple power switches SWa~SWf, a processing circuit 140, multiple driving circuits Da~Df, and multiple load-detecting circuits 160a~160c. The power conversion device 100, by selectively switching at least one of the power switches SWa~SWf, realizes power conversion between a multiphase AC power and a DC power. For example, the power conversion device 100 is able to convert the DC power Vdc to the three-phase AC power Va, Vb and Vc, in order to supply power to a three-phase load 900.

As shown in FIG. 1, the power switches SWa~SWf are configured to be turned on or turned off selectively according to a plurality of driving signals DS respectively, so as to perform the power conversion between the multiphase AC power and the DC power. For example, the power switches SWa~SWf may be realized by various elements such as Metal Oxide Semiconductor Field Effect Transistors (MOSFETs), Bipolar Junction Transistors (BJTs), or Insulated Gate Bipolar Transistors (IGBTs).

In the present embodiments, in structure, a first terminal of the power switch SWa is electrically coupled to a positive terminal 112 of the DC side of the power conversion device 100, and a second terminal of the power switch SWa is electrically coupled to a first terminal 132 of the AC side of the power conversion device 100. A first terminal of the power switch SWb is electrically coupled to the first terminal 132 of the AC side of the power conversion device 100, and a second terminal of the power switch SWb is electrically coupled to a negative terminal 114 (I.e., a ground terminal Vee) of the DC side of the power conversion device 100.

A first terminal of the power switch SWc is electrically coupled to the positive terminal 112 of the DC side of the power conversion device 100, and a second terminal of the power switch SWc is electrically coupled to the second terminal 134 of the AC side of the power conversion device 100. A first terminal of the power switch SWd is electrically coupled to the second terminal 134 of the AC side of the power conversion device 100, and a second terminal of the power switch SWd is electrically coupled to the negative terminal 114 (I.e., the ground terminal Vee) of the DC side of the power conversion device 100.

A first terminal of the power switch SWe is electrically coupled to the positive terminal 112 of the DC side of the power conversion device 100, and a second terminal of the power switch SWe is electrically coupled to a third terminal 136 of the AC side of the power conversion device 100. A first terminal of the power switch SWf is electrically coupled to the third terminal 136 of the AC side of the power conversion device 100, and a second terminal of the power switch SWf is electrically coupled to the negative terminal 114 (I.e., the ground terminal Vee) of the DC side of the power conversion device 100.

Thus, the power switches SWa~SWf may be formed a three-phase bridge inverter circuit, wherein the power switches SWa, SWb are performed as the upper arm switch and the lower arm switch of the A phase respectively, the power switches SWc, SWd are performed as the upper arm switch and the lower arm switch of the B phase respectively, and the power switches SWe, SWf are performed as the upper arm switch and the lower arm switch of the C phase respectively. Therefore, by selectively turning on one set of the upper arm switch and the lower arm switch in the same phase bridge arm via the pulse width modulation (PWM) method continuously, the DC voltage Vdc may be converted into the three-phase AC voltage Va, Vb and Vc respectively.

Specifically, in the present embodiments, the processing circuit 140 is configured to output switching signals, numbered as PWM, to the corresponding driving circuits Da~Df respectively. The switching signals PWM may be the pulse width modulation signals, but not to limit. In various embodiments, the processing circuit 140 may be realized by a circuit comprising a CPU, a microcontroller unit (MCU), a complex programmable logic device (CPLD), or a field-programmable gate array (FPGA).

In structure, the driving circuits Da~Df are electrically coupled to the corresponding one of the power switches SWa~SWf respectively. The driving circuits Da~Df are configured to output the driving signals DS to the corresponding power switches SWa~SWf according to the corresponding switching signals PWM respectively, in order to selectively control the power switches SWa~SWf to be turned on or turned off respectively.

In structure, the load-detecting circuits 160a, 160b and 160c are electrically coupled to the processing circuit 140 respectively, and arranged on corresponding outputting lines of A-phase, B-phase and C-phase of the AC side of the power conversion device 100 respectively. The load-detecting circuits 160a, 160b and 160c are able to detect the load states of the corresponding power switches SWa~SWf, and to determine A-phase, B-phase and C-phase are whether in the states of relative light load or heavy load, and to output the corresponding load-detecting signals CDa, CDb and CDc to the processing circuit 140 respectively.

For example, in some embodiments, the load-detecting circuits 160a, 160b and 160c are configured to detect the load current Ia, Ib and Ic passing through the corresponding power switches SWa~SWf, as bold black arrow shown in FIG. 1, and to output the corresponding load-detecting signals CDa, CDb and CDc to the processing circuit 140 according to current-detecting signals respectively. Furthermore, in some other embodiments, the load-detecting circuits 160a, 160b and 160c are also configured to detect the output AC voltages Va, Vb and Vc of A-phase, B-phase and C-phase, and to output the corresponding load-detecting signals CDa, CDb and CDc to the processing circuit 140 according to the voltage-detecting signals respectively. In various embodiments, the load-detecting circuits 160a, 160b and 160c may be implemented by various voltage and/or current sensing elements on demanded designs.

Therefore, the processing circuit 140 is able to respectively control the operations of the corresponding driving circuits Da~Df according to the load-detecting signals CDa, CDb and CDc. In the following paragraphs, the specific circuit and detailed operation of the driving circuits Da~Df will be further described with accompanying the related diagrams.

Figure 2:
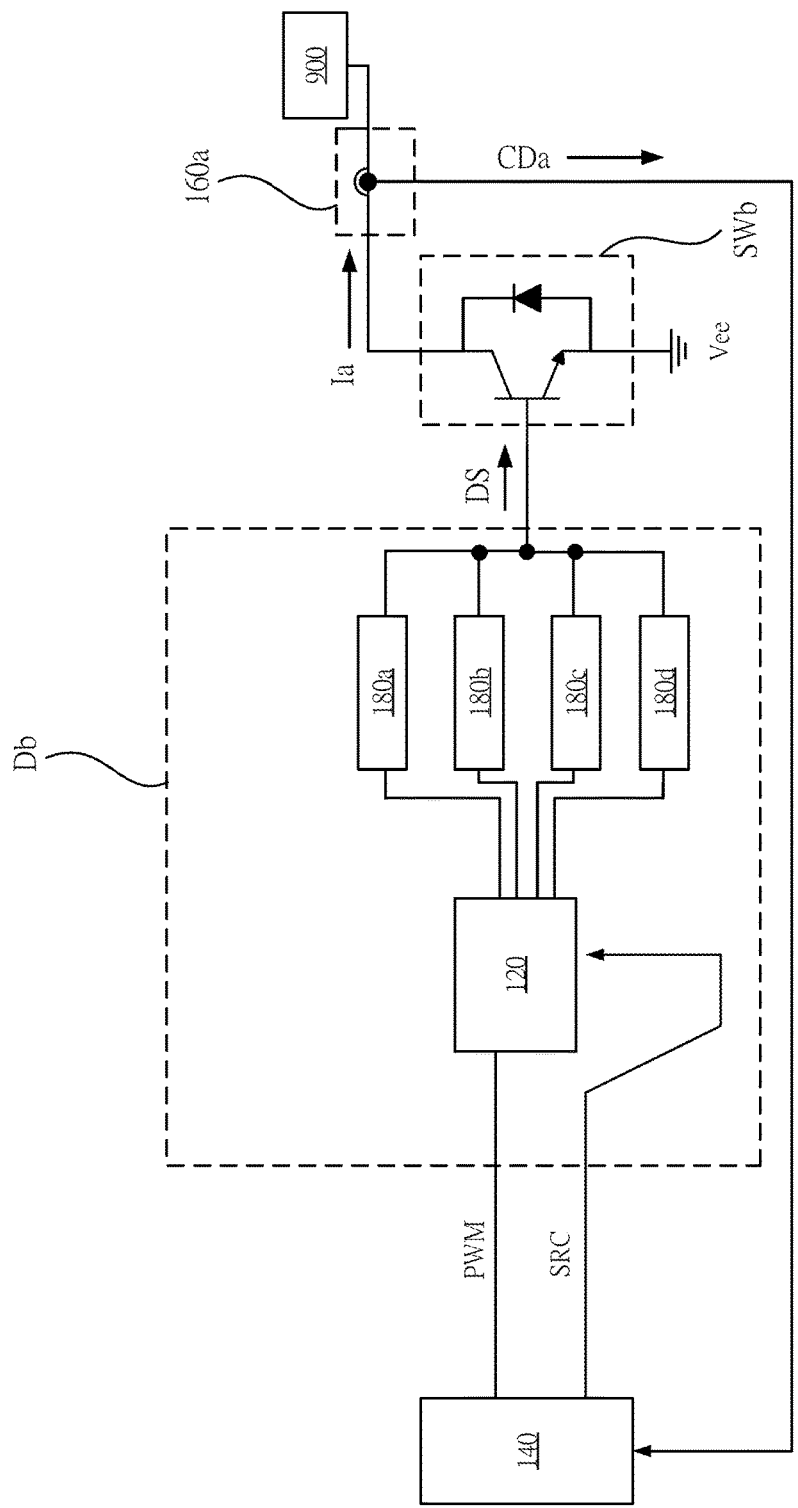
FIG. 2 is a schematic diagram illustrating operation of a driving circuit and a corresponding power switch in accordance with some embodiments of the disclosure.

Please refer to FIG. 2 together. FIG. 2 is a schematic diagram illustrating operation of the driving circuit Db and the corresponding power switch SWb in accordance with some embodiments of the present disclosure. For the convenience of explanation, the operation of the driving circuit Db and the corresponding power switch SWb illustrated in FIG. 2 is explained with accompanying of the power conversion device 100 of FIG. 1. In FIG. 2, similar elements related to the embodiments in FIG. 1 are represented by the same reference symbols for ease of understanding. It should be noted that, in FIG. 2, one of the driving circuits, Db, and its corresponding power switch SWb are used as an example. Those of ordinary skilled in the art should understand that other driving circuits Da, Dc~Df and the corresponding power switches SWa, SWc~SWf may have similar structures and/or operations, and thus further explanation is omitted.

As shown in FIG. 2, in some embodiments, the driving circuit Db includes a power switch driver 120 and a plurality of current-limiting circuits 180a~180d. The processing circuit 140 is configured to output the switching signals PWM and the mode-selecting signal (here numbered as the slew-rate control) SRC to the power switch driver 120 in the driving circuit Db, but not to limit.

In structure, the power switch driver 120 is electrically coupled to the processing circuit 140, and configured to receive the switching signal PWM and the mode-selecting signal SRC from the processing circuit 140. Therefore, the power switch driver 120 may output the corresponding driving signal DS according to the corresponding switching signal PWM.

Input terminals of the current-limiting circuits 180a~180d are electrically coupled to the corresponding output terminals of the power switch driver 120 respectively. Output terminals of the current-limiting circuits 180a~180d are electrically coupled to each other at the corresponding control terminal of the power switch SWb.

In this way, the power switch driver 120 may output the corresponding driving signal DS selectively via the corresponding one of the output terminals according to the load state of the power switch SWb, that is, the driving signal DS may be outputted to the control terminal of the power switch SWb via one of the current-limiting circuits 180a~180d.

Specifically, after the processing circuit 140 receives the load-detecting signal CDa from the load-detecting circuit 160a, load states of the power switch SWb may be determined, and the corresponding mode-selecting signal SRC may be outputted according to the various load states. Therefore, the power switch driver 120 may output the driving signal DS selectively via the corresponding output terminal according to the mode-selecting signal SRC, such that the driving signal DS is transmitted to the power switch SWb via one of the current-limiting circuits 180a~180b.

Figures 3A, 3B:
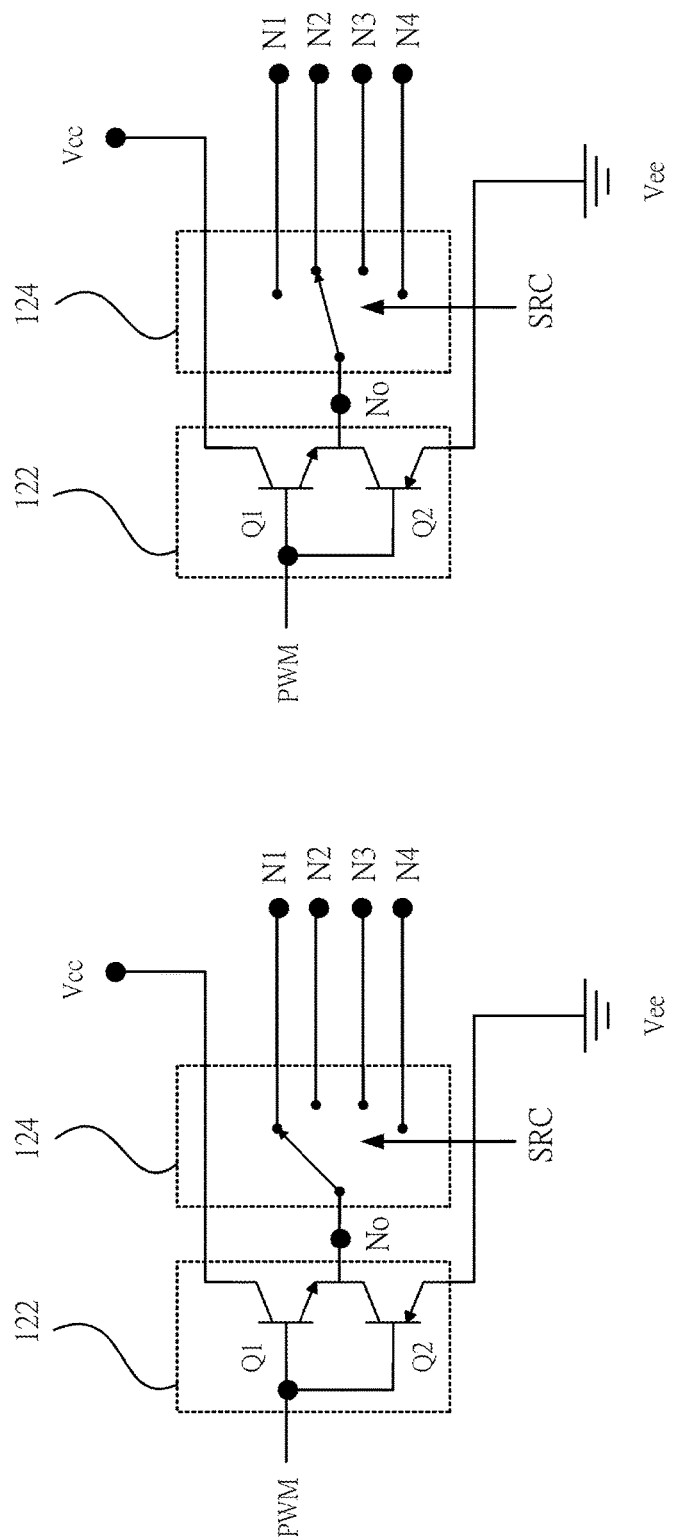
FIG. 3A and FIG. 3B are schematic diagrams illustrating operations of a power switch driver in accordance with some embodiments of the disclosure.

Please refer to FIG. 3A and FIG. 3B. FIG. 3A and FIG. 3B are schematic views of operating the power switch driver 120 illustrated in accordance with some embodiments of the disclosure. As shown in FIG. 3, in some embodiments, the power switch driver 120 includes an amplifier circuit 122 and a switch circuit 124.

The amplifier circuit 122 is configured to amplify the switching signal PWM to generate the driving signal DS. As shown in figure, in some embodiments, the amplifier circuit 122 includes a transistor Q1 and a transistor Q2. In structure, the first terminal of the transistor Q1 is electrically coupled to the voltage source Vcc, the second terminal of the transistor Q1 is electrically coupled to the output terminal No of the amplifier circuit 122, and the control terminal of the transistor Q1 is configured to receive the switching signal PWM. The first terminal of the transistor Q2 is electrically coupled to the output terminal No of the amplifier circuit 122, the second terminal of the transistor Q2 is electrically coupled to the ground terminal Vee (i.e., grounded), and the control terminal of the transistor Q2 is configured to receive the switching signal PWM.

For example, the transistor Q1 and the transistor Q2 may be realized by different types of semiconductor elements. For example, the transistor Q1 may be an N-type semiconductor switch element, and the transistor Q2 may be a P-type semiconductor switch element. In this way, when the switching signal PWM is at an enable level (e.g., high level), the transistor Q1 is turned on and the transistor Q2 is turned off, and the voltage level of the output terminal No of the amplifier circuit 122 is at the high level corresponding to the voltage source Vcc. On the other hand, when the switching signal PWM is at a disable level (e.g., low level), the transistor Q1 is turned off and the transistor Q2 is turned on, and the voltage level of the output terminal No of the amplifier circuit 122 is at the low level corresponding to the ground terminal Vee. Therefore, the amplifier circuit 122 may amplify the switching signal PWM by the transistor Q1 and the transistor Q2, to generate the driving signal DS with a higher voltage level to drive the power switch SWb, so as to drive the large signal circuit by a small signal.

The switching circuit 124 is electrically coupled to the output terminal No of the amplifier circuit 122, and configured to selectively couple the output terminal No of the amplifier circuit 122 to the corresponding one of output terminals N1, N2, N3, and N4 of the power switch driver 120 according to the mode-selecting signal SRC, to provide the driving signal DS to the corresponding one of the current-limiting circuits 180a~180d, please refer with FIG. 2.

For example, in some embodiments, the conducting resistance of the current-limiting circuit 180a is larger than the conducting resistance of the current-limiting circuit 180b. When the load current Ia passing though the power switch SWb is smaller than a first threshold, the switch circuit 124 may selectively couple the output terminal No of the amplifier circuit 122 to the output terminal N1 of the power switch driver 120 according to the corresponding mode-selecting signal SRC, such that the power switch driver 120 outputs the driving signal DS via the output terminal N1 corresponding to the current-limiting circuit 180a, as shown in FIG. 3A.

On the other hand, when the load current Ia is larger than or equal to the first threshold, the switch circuit 124 may selectively couple the output terminal No of the amplifier circuit 122 to the output terminal N2 of the power switch driver 120 according to the corresponding mode-selecting signal SRC, such that the power switch driver 120 outputs the driving signal DS via the output terminal N2 corresponding to of the current-limiting circuit 180b, as shown in FIG. 3B, and so as the control of other mode-switching, the further details are omitted for the sake of brevity and not repeated herein.

In other words, the processing circuit 140 may obtain the corresponding voltage or current information of the power switches SWa~SWf according to load-detecting signals CDa~CDc, in order to determine that the power conversion device 100 operates in multiple levels of load modes (e.g., heavy load, medium load, light load, or empty load . . . ). Therefore, the processing circuit 140 may output the mode-selecting signal SRC which representing the load mode to the switch circuit 124, and correspondingly switch one of the current-limiting circuits 180a~180d, to adjust the value of the conducting resistance and the cut-off resistance. In this way, the driving currents outputted by the driving circuits Da~Df may be adjusted to be driven by different driving currents according to different load states (or load modes), and thus the slew rate and switching loss of switching the power switches SWa~SWf may be dynamically adjusted, so as to improve system performance.

For example, when the system is in heavy load state, the driving signal DS may be outputted via the current-limiting circuit with a smaller conducting resistance such as 180a or 180b, and the system is driven by a higher driving current. On the other hand, when the system is in light load state, the driving signal DS may be outputted via the current-limiting circuit with a larger conducting resistance such as 180c or 180d and the system is driven by a lower driving current. Therefore, the slew rate may be maintained within the target operating range in different load states, to control the time of turning on or turning off the switches, so as to reduce the switching loss and to avoid an excessively high slew rate resulting in unnecessary EMI.

In addition, in some other embodiments, the power switch driver 120 may also be implemented by an isolated driver architecture, the isolation circuit such as a photo coupler, a magnetic isolation type, or a capacitive isolation type is further arranged between the input terminal and the amplifier circuit 122, in order to isolate the low-voltage side of the input terminal of the power switch driver 120 and the high-voltage side of the output terminal, so as to meet the safety requirements.

Figure 4:
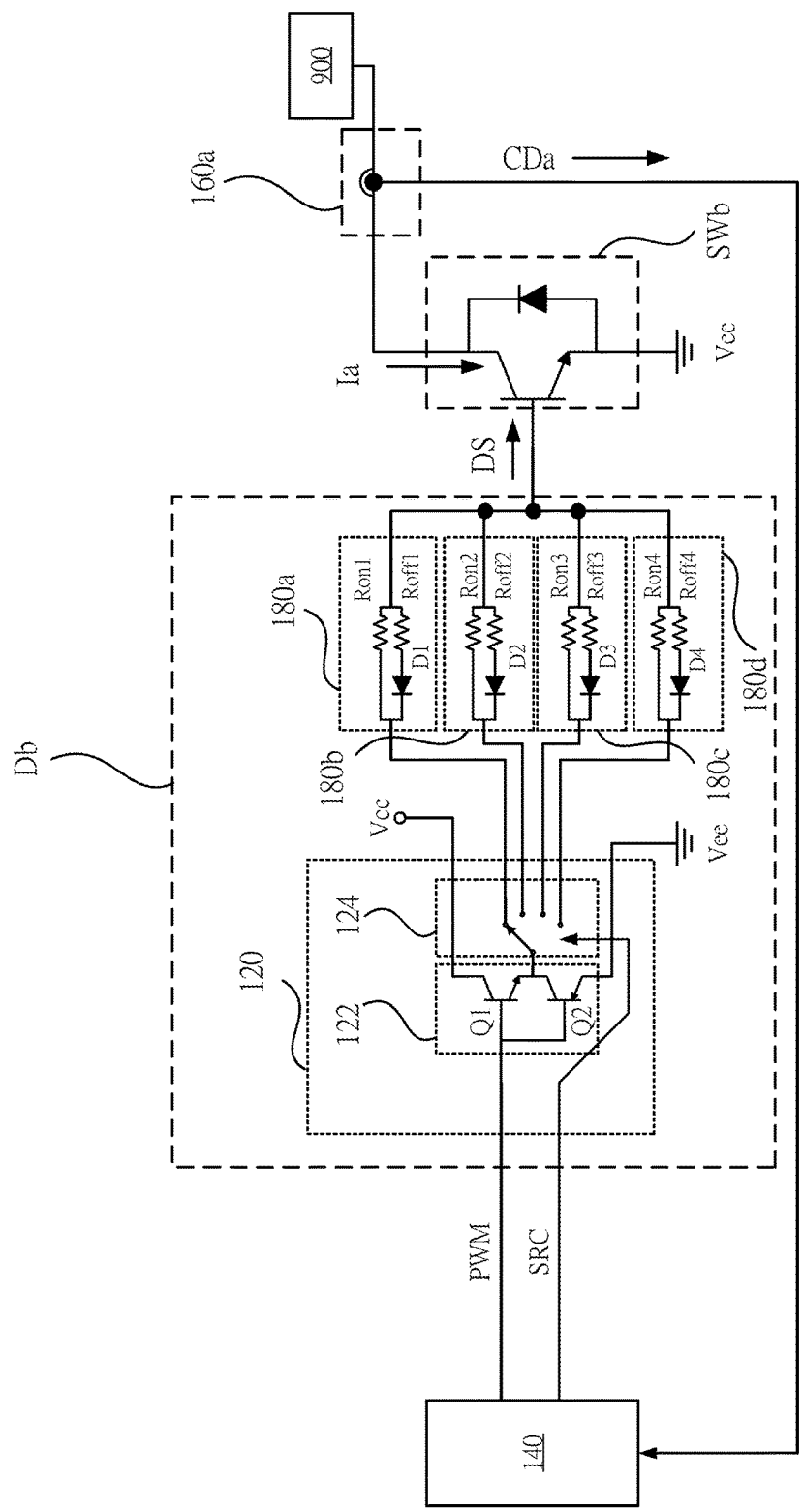
FIG. 4 is an operating diagram of a driving circuit and a corresponding power switch illustrated in accordance with some embodiments of the disclosure.

Please refer to FIG. 4. FIG. 4 is a schematic diagram illustrating the operation of the driving circuit Db and the corresponding power switch SWb in accordance with some embodiments of the disclosure. In FIG. 4, the similar elements related to the embodiment in FIG. 2 are represented by the same reference symbols for easily understanding.

As shown in FIG. 4, each one of a plurality of current-limiting circuits 180a~180d of the driving circuit Db respectively includes conducting resistance units Ron1~Ron4, diode units D1~D4, and cut-off resistance units Roff1~Roff4. In structure, conducting resistance units Ron1~Ron4 are electrically coupled between the first terminal and the second terminal of corresponding current-limiting circuits 180a~180d respectively, and form the current path for providing the driving current on the first branch when the driving signal DS turns on the power switch SWb.

On the other hand, the cut-off resistance units Roff1~Roff4 and the corresponding diode units D1~D4 are connected in series respectively, and electrically coupled between the first terminal and the second terminal of the corresponding current-limiting circuits 180a~180d, and form the current path for providing the driving current on the second branch when the driving signal DS turns off the power switch SWb.

Therefore, the conducting resistances Ron1~Ron4 and the cut-off resistances Roff1~Roff4 of the current-limiting circuits 180a~180d may be respectively set by realizing the conducting resistance units Ron1~Ron4 and the cut-off resistance units Roff1~Roff4 with components having different resistances, so as to adjust the value of the driving current. In addition, in some other embodiments, the current-limiting circuits 180a~180d may further include the corresponding inductor units to adjust the driving current, the current-limiting circuits 180a~180d illustrated in the FIG. 4 are merely possible embodiments of the present disclosure, and not meant to limit the present disclosure. Furthermore, the conducting resistance units Ron1~Ron4 and the cut-off resistance units Roff1~Roff4 may be current-limiting elements designed by or equipped with ferrite beads.

Figure 5:
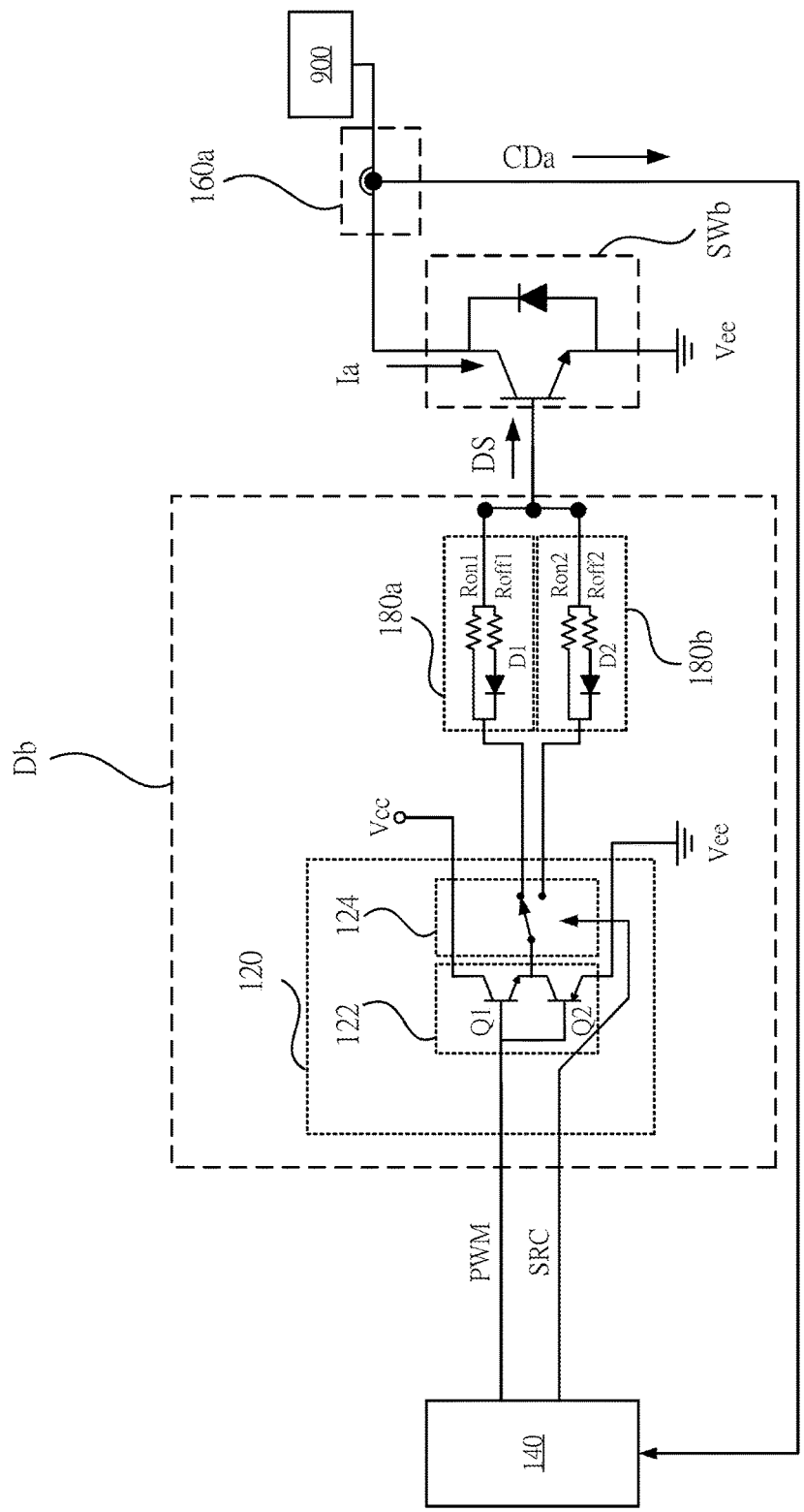
FIG. 5 is an operating diagram of a driving circuit and a corresponding power switch illustrated in accordance with some other embodiments of the disclosure.

Furthermore, although in the embodiments shown in FIGS. 2-4, the driving circuit Db includes four sets of current-limiting circuits 180a~180d, respectively corresponding to four different sets of load current levels, the present disclosure is not limited thereto. Please refer to FIG. 5. FIG. 5 is a schematic diagram illustrating the operation of the driving circuit Db and the corresponding power switch SWb in accordance with some other embodiments of the disclosure.

As shown in FIG. 5, in some embodiments, the driving circuit Db may only include two sets of current-limiting circuits 180a, 180b corresponding to two sets of the different load current levels, in order to switch according to different mode-selecting signals SRC, and to output the driving signal DS by one of the current-limiting circuits 180a, 180b as the outputting path, so as to adjust the value of the driving current.

In other words, those skilled in the art may adjust the number of the current-limiting circuits, the number of load modes, and the corresponding thresholds according to the actual needs of the circuit designs. The circuits shown in the disclosures are merely possible embodiments, and not intended to limit the present disclosure.

Figure 6:
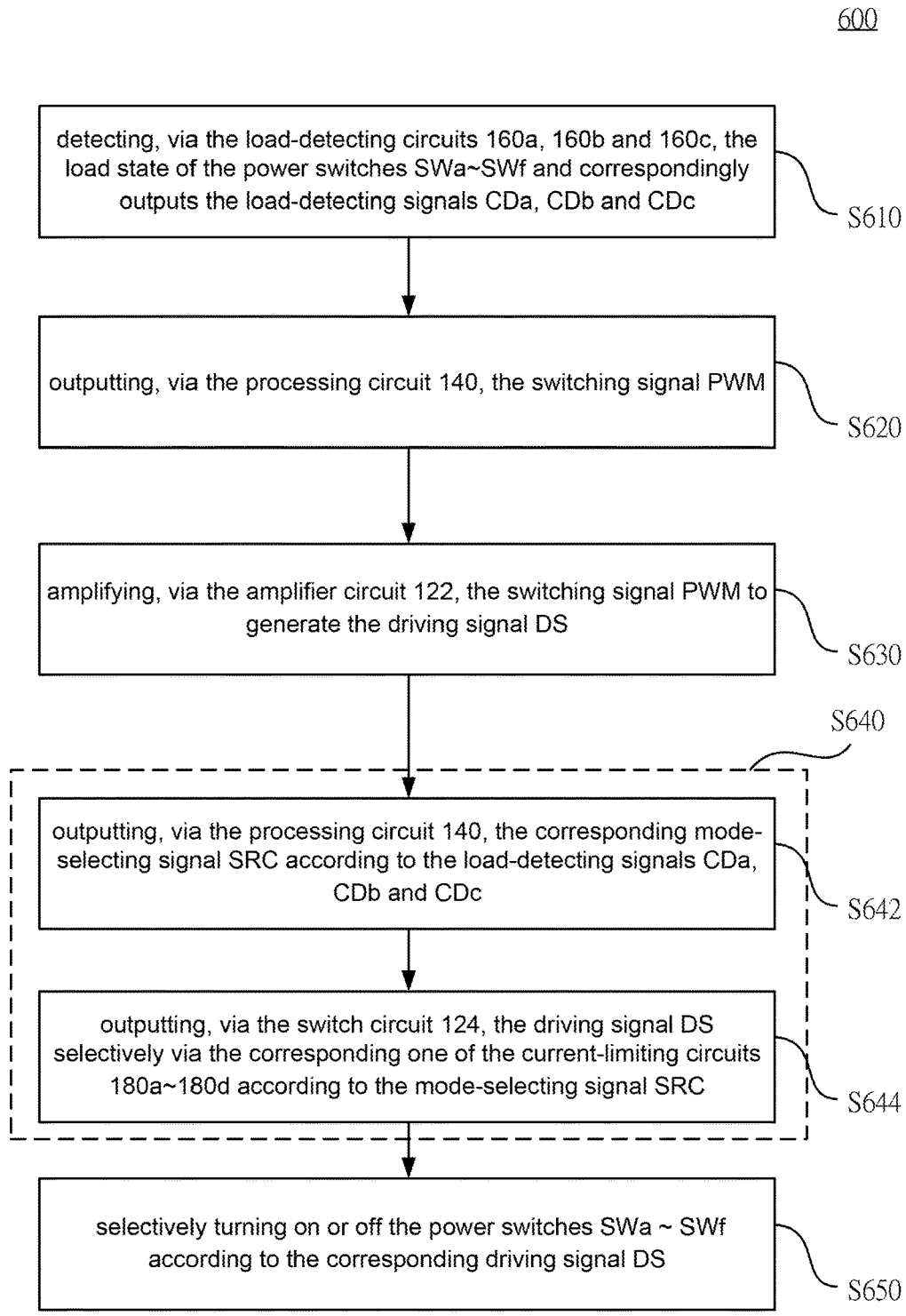
FIG. 6 is a flowchart of a power switch driving method illustrated in accordance with some embodiments of the disclosure.

Please refer to FIG. 6. FIG. 6 is a flowchart illustrating a power switch driving method 600 in accordance with some embodiments of the disclosure. For the convenience and clarity of explanation, the following power switch driving method 600 is described in accompanying with the embodiments shown in FIGS. 1~5, but not limited thereto. Various alterations and modifications may be performed on the disclosure by those of ordinary skilled in the art without departing from the principle and spirit of the disclosure. As shown in FIG. 6, the driving method 600 includes steps S610, S620, S630, S640, and S650.

Firstly, in the step S610, the power conversion device 100, via the load-detecting circuits 160a, 160b and 160c, detects the load states of the power switches SWa~SWf and correspondingly outputs the load-detecting signals CDa, CDb and CDc.

Next, in the step S620, the power conversion device 100, via the processing circuit 140, outputs the switching signal PWM.

Next, in the step S630, the power conversion device 100, via the amplifier circuit 122, amplifies the switching signal PWM to generate the driving signal DS.

Next, in the step S640, the power conversion device 100, via the processing circuit 140, determines the load modes according to the load-detecting signals CDa, CDb and CDc, to output the driving signal DS to the control terminals of the power switches SWa~SWf selectively via the corresponding one of the current-limiting circuits 180a~180d according to the load modes.

Specifically, in some embodiments, the step S640 further includes a step S642 and a step S644.

In the step S642, the power conversion device 100, via the processing circuit 140, outputs the corresponding mode-selecting signal SRC according to the load-detecting signals CDa, CDb and CDc.

In the step S644, the power conversion device 100, via the switch circuit 124, outputs the driving signal DS selectively via the corresponding one of the current-limiting circuits 180a~180d according to the mode-selecting signal SRC.

In some embodiments, when the processing circuit 140 determines that the load currents Ia~Ic passing through the power switches SWa~SWf are smaller than the first threshold, the power conversion device 100 outputs the driving signal DS via the first current-limiting circuit 180a. When the processing circuit 140 determines that the load currents Ia~Ic are larger than or equal to the first threshold, the power conversion device 100 may output the driving signal DS via the second current-limiting circuit 180b, wherein the conducting resistance of the first current-limiting circuit 180a is greater than the conducting resistance of the second current-limiting circuit 180b.

Similarly, when the processing circuit 140 further determines that the load currents Ia~Ic are larger than or equal to the second threshold, the power conversion device 100 may output the driving signal DS via the third current-limiting circuit 180c. When the processing circuit 140 further determines that the load currents Ia~Ic are larger than or equal to the third threshold, the power conversion device 100 may output the driving signal DS via the fourth current limiting circuit 180d. The second threshold is larger than the first threshold, and the third threshold is larger than the second threshold. The conducting resistance of the second current-limiting circuit 180b is larger than the conducting resistance of the third current-limiting circuit 180c, and the conducting resistance of the third current-limiting circuit 180c is larger than the conducting resistance of the fourth current limiting circuit 180d.

Finally, in step S650, the power conversion device 100 selectively turns on or turns off the power switches SWa~SWf according to the corresponding driving signal DS.

Those of ordinary skill in the art may directly understand how the driving method 600 of the power switch is based on the power conversion device 100 in the foregoing various embodiments to perform the operations and functions, and details are not described here again.

In the foregoing, exemplary steps are included. However, these steps do not need to be performed sequentially. The steps mentioned in the embodiment may be adjusted according to actual needs unless the order is specifically stated, and may even be performed simultaneously or partially simultaneously.

Furthermore, each of the above embodiments may be implemented by various types of digital or analog circuits or by different integrated circuit chips. Individual components may also be integrated into a single control chip. Various control circuits may also be implemented by various processors or other integrated circuit chips. The above is only an example, and it should not limit the present disclosure.

In summary, in various embodiments of the present disclosure, load current information or voltage information is obtained by using a current or voltage signal of a feedback load, and the different outputting modes are selected according to one or more thresholds to switch the output paths of the driving signal, and change the amplitude of the driving current. Therefore, the slew rate of switching the power switches may be adjusted and the switching loss may be controlled.

In this way, when different loads are outputted, the driving ability of the driving circuit may be adjusted to effectively reduce the slew rate of switching the power switches and reduce the electromagnetic interference. Furthermore, the driving capability of the driving circuit may also be adjusted to improve the switching loss of the power switch, reduce the switching loss of the power switch, and improve the overall energy efficiency of the system.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A driving circuit, comprising:
   a power switch driver configured to output a driving signal according to a switching signal; and
   a plurality of current-limiting circuits, wherein each of the current-limiting circuits has an input terminal electrically coupled to a corresponding one of a plurality of output terminals of the power switch driver respectively, and a plurality of output terminals of the current-limiting circuits are electrically coupled to a control terminal of a power switch;
   wherein the power switch driver selectively outputs the driving signal via one of a plurality of output terminals according to a load state of the power switch, such that the driving signal is outputted to the control terminal of the power switch via one of the current-limiting circuits.

2. The driving circuit of claim 1, wherein the current-limiting circuit comprises a first current-limiting circuit and a second current-limiting circuit, and a conducting resistance of the first current-limiting circuit is larger than a conducting resistance of the second current-limiting circuit;
   on the condition that a load current passing through the power switch is smaller than a first threshold, the power switch driver outputs the driving signal via one of the output terminals corresponding to the first current-limiting circuit; and
   on the condition that the load current is larger than or equal to the first threshold, the power switch driver outputs the driving signal via one of the output terminals corresponding to the second current-limiting circuit.

3. The driving circuit of claim 1, wherein the power switch driver is further configured to receive the switching signal from a processing circuit.

4. The driving circuit of claim 3, wherein the processing circuit is further configured to output a mode-selecting signal to the power switch driver, such that the power switch driver selectively outputs the driving signal via one of the output terminals according to the mode-selecting signal.

5. The driving circuit of claim 4, wherein the processing circuit is further configured to receive a load-detecting signal from a load-detecting circuit, and to output the mode-selecting signal according to the load-detecting signal, wherein the load-detecting circuit is configured to detect the load state of the power switch.

6. The driving circuit of claim 4, wherein the power switch driver comprises:
   an amplifier circuit configured to amplify the switching signal to generate the driving signal; and
   a switching circuit configured to selectively couple an output terminal of the amplifier circuit to one of the output terminals of the power switch driver according to the mode-selecting signal to provide the driving signal to the corresponding current-limiting circuit.

7. The driving circuit of claim 6, wherein the amplifier circuit comprises:
   a first transistor, wherein a first terminal of the first transistor is electrically coupled to a first voltage source, a second terminal of the first transistor is electrically coupled to the output terminal of the amplifier circuit, and a control terminal of the first transistor is configured to receive the switching signal; and
   a second transistor, wherein a first terminal of the second transistor is electrically coupled to the output terminal of the amplifier circuit, a second terminal of the second transistor is grounded, and a control terminal of the second transistor is configured to receive the switching signal.

8. The driving circuit of claim 1, wherein each of the current-limiting circuits comprises:
a conducting resistance unit electrically coupled between a first terminal and a second terminal;
a diode unit; and
a cut-off resistance unit,
wherein the cut-off resistance unit and the diode unit are connected in series, and electrically coupled between the first terminal and the second terminal.

9. A power conversion device, comprising:
a plurality of power switches configured to be turned on or turned off selectively according to a plurality of driving signals respectively, so as to perform power conversion between an AC power and a DC power;
a processing circuit configured to output a plurality of switching signals respectively; and
a plurality of driving circuits electrically coupled between the processing circuit and a corresponding one of the power switches respectively, so as to output the driving signals according to the switching signals respectively, wherein each of the driving circuits comprises:
a power switch driver configured to output the driving signal according to the corresponding switching signal; and
a plurality of current-limiting circuits, wherein each of the current-limiting circuits has an input terminal electrically coupled to a corresponding one of a plurality of output terminals of the power switch driver respectively, and a plurality of output terminals of the current-limiting circuits are electrically coupled to a control terminal of the corresponding power switch;
wherein the power switch driver selectively outputs the driving signal via the corresponding one of the output terminals according to a load current passing though the corresponding power switch, such that the driving signal is outputted to the control terminal of the power switch via one of the current-limiting circuits.

10. The power conversion device of claim 9, wherein the current-limiting circuit comprises a first current-limiting circuit and a second current-limiting circuit, and a conducting resistance of the first current-limiting circuit is larger than a conducting resistance of the second current-limiting circuit;
on the condition that the load current is smaller than a first threshold, the power switch driver outputs the driving signal via one of the output terminals corresponding to the first current-limiting circuit; and
on the condition that the load current is larger than or equal to the first threshold, the power switch driver outputs the driving signal via one of the output terminals corresponding to the second current-limiting circuit.

11. The power conversion device of claim 9, wherein the processing circuit is further configured to output a mode-selecting signal to the corresponding power switch driver of the driving circuits, such that the power switch driver of the driving circuits selectively outputs the driving signal via one of the output terminals according to the mode-selecting signal.

12. The power conversion device of claim 11 further comprising:

a plurality of load-detecting circuits electrically coupled to the processing circuit, and configured to detect the load currents passing though the corresponding power switch, and to output a plurality of corresponding load-detecting signals to the processing circuit respectively; and
wherein the processing circuit is further configured to output the mode-selecting signals according to the load-detecting signals.

13. The power conversion device of claim 11, wherein the power switch driver comprises:
an amplifier circuit configured to amplify the switching signal to generate the driving signal; and
a switching circuit configured to selectively couple an output terminal of the amplifier circuit to one of the output terminals of the power switch driver according to the mode-selecting signal to provide the driving signal to the corresponding current-limiting circuit.

14. The power conversion device of claim 13, wherein the amplifier circuit comprises:
a first transistor, wherein a first terminal of the first transistor is electrically coupled to a first voltage source, a second terminal of the first transistor is electrically coupled to the output terminal of the amplifier circuit, and a control terminal of the first transistor is configured to receive the switching signal; and
a second transistor, wherein a first terminal of the second transistor is electrically coupled to the output terminal of the amplifier circuit, a second terminal of the second transistor is grounded, and a control terminal of the second transistor is configured to receive the switching signal.

15. The power conversion device of claim 9, wherein each of the current-limiting circuits comprises:
a conducting resistance unit electrically coupled between a first terminal and a second terminal;
a diode unit; and
a cut-off resistance unit, wherein the cut-off resistance unit and the diode unit are connected in series, and electrically coupled between the first terminal and the second terminal.

16. The power conversion device of claim 9, wherein the power switches comprise:
a first power switch, wherein a first terminal of the first power switch is electrically coupled to a positive terminal of a DC side of the power conversion device, and a second terminal of the first power switch is electrically coupled to a first terminal of an AC side of the power conversion device;
a second power switch, wherein a first terminal of the second power switch is electrically coupled to the first terminal of the AC side of the power conversion device, and a second terminal of the second power switch is electrically coupled to a negative terminal of the DC side of the power conversion device;
a third power switch, wherein a first terminal of the third power switch is electrically coupled to the positive terminal of the DC side of the power conversion device, and a second terminal of the third power switch is electrically coupled to a second terminal of the AC side of the power conversion device;
a fourth power switch, wherein a first terminal of the fourth power switch is electrically coupled to the second terminal of the AC side of the power conversion device, and a second terminal of the fourth power switch is electrically coupled to the negative terminal of the DC side of the power conversion device;

a fifth power switch, wherein a first terminal of the fifth power switch is electrically coupled to the positive terminal of the DC side of the power conversion device, and a second terminal of the fifth power switch is electrically coupled to a third terminal of the AC side of the power conversion device; and a sixth power switch, wherein a first terminal of the sixth power switch is electrically coupled to the third terminal of the AC side of the power conversion device, and a second terminal of the sixth power switch is electrically coupled to the negative terminal of the DC side of the power conversion device.

17. A power switch driving method, comprising steps of:

detecting a load state of the power switch and correspondingly outputting a load-detecting signal by a load-detecting circuit;

determining, by a processing circuit, a load mode according to the load-detecting signal to selectively output a driving signal to a control terminal of the power switch via one of a plurality of current-limiting circuits according to the load mode; and turning on or turning off the power switch selectively according to the driving signal.

18. The power switch driving method of claim 17, further comprising steps of:

outputting the driving signal via a first current-limiting circuit of the current-limiting circuits on the condition that the processing circuit determines that a load current passing though the power switch is smaller than a first threshold; and outputting the driving signal via a second current-limiting circuit of the current-limiting circuits on the condition that the processing circuit determines that the load current is larger than or equal to the first threshold, wherein a conducting resistance of the first current-limiting circuit is larger than a conducting resistance of the second current-limiting circuit.

19. The power switch driving method of claim 17, further comprising steps of:

outputting a switching signal by the processing circuit; and amplifying the switching signal to generate the driving signal by an amplifier circuit.

20. The power switch driving method of claim 17, further comprising steps of:

outputting a corresponding mode-selecting signal according to the load-detecting signal by the processing circuit; and outputting the driving signal via one of the current-limiting circuits selectively according to the mode-selecting signal by a switching circuit.

\* \* \* \* \*